US006597416B1

(12) United States Patent  (10) Patent No.: US 6,597,416 B1
Momose  (45) Date of Patent: Jul. 22, 2003

(54) DISPLAY PANEL WITH SUPPORTING MEMBER HAVING RECESS FOR ELASTIC CONNECTOR (75) Inventor: Norihide Momose, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/513,246

(22) Filed: Feb. 23, 2000

(30) Foreign Application Priority Data

Mar. 29, 1999 (JP) ............................................ 11-086958
Feb. 10, 2000 (JP) ......................................... 2000-033213

(51) Int. Cl.⁷ ...................... G02F 1/1333; G02F 1/1345
(52) U.S. Cl. ........................... 349/60; 349/58; 349/149; 349/150
(58) Field of Search ............................ 349/58, 60, 149, 349/150, 151, 152

(56) References Cited

U.S. PATENT DOCUMENTS

| 4,012,117 | A | * | 3/1977 | Lazzery | ....................... 350/160 |
| 4,165,607 | A | * | 8/1979 | Fedorowicz et al. | ............ 58/50 |
| 4,357,061 | A | * | 11/1982 | Crosby | ......................... 339/17 |
| 4,545,647 | A | * | 10/1985 | Sasaki et al. | ................ 350/331 |
| 4,614,406 | A | * | 9/1986 | Motoi | ......................... 350/334 |

FOREIGN PATENT DOCUMENTS

| JP | 54-14683 | 7/1977 |
| JP | 54-083455 | 7/1979 |
| JP | 62-132523 | 8/1987 |
| JP | 3-86323 | 8/1991 |
| JP | 03-228026 | 10/1991 |
| JP | 4-48575 | 4/1992 |
| JP | 5-69737 | 9/1993 |
| JP | 05-341306 | 12/1993 |
| JP | 08-201840 | 8/1996 |
| JP | 09-288278 | 11/1997 |
| JP | 10-026939 | 1/1998 |

* cited by examiner

Primary Examiner—Toan Ton
Assistant Examiner—Andrew Schechter
(74) Attorney, Agent, or Firm—Mark P. Watson (57) ABSTRACT

An apparatus for providing a flat panel display device such as a liquid crystal display device, which allows a liquid crystal panel supported by a supporting member to be easily attached to a device by means of automation. According to this flat panel display, a recess 24a is formed in a thick part 24. A flexible interconnection board 16 is introduced into the recess 24a via an opening recess 24b. The part of the flexible interconnection board 16 introduced in the recess 24a is reinforced by a stiffener 18 adhesively bonded to the flexible interconnection board 16. The stiffener 18 is firmly attached to the bottom face of the recess 24 via fixing means 25. A rubber connector is adhesively bonded to the surface, opposite to the adhesive surface to which the stiffener 18 is bonded, of the flexible interconnection board 16. The rubber connector 19 is formed of an elastic base member 19a made of synthetic rubber or the like and a large number of conductive wires 19b extending through the elastic base member 19a in a direction from the front to back sides of the elastic base member 19a.

18 Claims, 6 Drawing Sheets

DISPLAY PANEL WITH SUPPORTING MEMBER HAVING RECESS FOR ELASTIC CONNECTOR

BACKGROUND OF THE INVENTION

1. Field of the Invention

The present invention relates to a flat display such as a liquid crystal display device or organic electronic-luminescence display device e.g., and more particularly, to the structure of a flat panel display device including a supporting member for mounting a liquid crystal panel on various devices.

2. Description of the Related Art

In general, when a flat panel display device such as liquid crystal panel is attached to an electronic device such as portable phone or personal computer, a supporting member made of a synthetic resin is employed to support the liquid crystal panel. The supporting member includes an engaging element via which the supporting member is attached to a circuit board or the like disposed in the electronic device. Various types of engaging elements are known. They include a screw hole via which the supporting member is fastened to the circuit board with a screw, a hook-shaped element designed to be inserted into a fixing hole formed in the circuit board such that the hook-shaped element engages the fixing hole, etc.

Some supporting members include a backlight or at least a part, such as a light guiding member for guiding light from light source toward liquid crystal panel, of the backlight disposed behind the liquid crystal panel. Sometimes the backlight or the part of the backlight is formed integrally with the supporting member. In this case, the supporting member is formed by means of molding using a transparent resin such as acrylic resin, polycarbonate resin, etc. In this case, a light emitting element such as an LED serving as a light source of the backlight is generally mounted on a circuit board of an electronic device such that the light emitting element is located at the side of an end of the light guiding member of the supporting member mounted on the circuit board thereby allowing light emitted from the light emitting element to be introduced into (incident on) the light guiding member via its end. In some cases, the light emitting element is mounted on the supporting member.

When the liquid crystal panel is attached to the circuit board or the like via the supporting member as described above, electrical connection between the liquid panel and the circuit board of the electronic device is achieved by means of inserting or fitting (engaging) an interconnection terminal part, which is formed on an end portion of a flexible interconnection board electrically connected to the liquid crystal panel, into a connector mounted on the circuit board or by means of soldering. In this case, when the liquid crystal panel is mounted on the circuit board, the liquid crystal panel is first supported by the supporting member, and then the supporting member is firmly attached to the circuit board. After that, the connection terminal part formed on the end portion of the flexible interconnection board electrically connected in advance to the liquid crystal panel is connected to the connector. In the case where connection is made by means of soldering, soldering is performed after positioning the end portion of the flexible interconnection board relative to the terminal part on the circuit board.

Various types of connectors are known for use as the connector mounted on the circuit board. They include a connector having an opening slit into which the connection terminals of the flexible interconnection board is inserted, a connector designed to receive the connection terminals of the flexible interconnection board such that the connection terminals engages the connector in a fastener-like fashion, a connector including a movable part capable of being opened and closed wherein, to make a connection, the connection terminal part is placed on the pin terminals of the connector and then the movable part is closed thereby catching the connection terminal part from both sides, etc.

However, the conventional techniques have the following problems. When the conventional flat display panel such as liquid crystal panel is attached to an electronic device, it is required to separately perform the attachment (assembling) of the supporting member and the electrical connection of the liquid crystal panel. Another disadvantage is that a complicated operation is required to solder a flexible interconnection board and a circuit board, or to connect the connection terminals of the flexible interconnection board connected to the liquid crystal panel to the connector of a circuit board. Therefore, the attaching (assembling) operation has to be performed manually step by step. Thus, it is very difficult to mount the liquid crystal panel on an electronic device by means of automation.

OBJECTS OF THE INVENTION

Thus, a general object of the present invention is to solve the above problems. More specifically, it is an object of the present invention to provide a structure of a flat panel display such as a liquid crystal display device which allows a display panel supported by a supporting member to be easily attached to a device by means of automation.

SUMMARY OF THE INVENTION

According to an aspect of the present invention, to achieve the above object, a supporting member is arranged behind a display panel which has a flat shape. The flat shaped panel such as a liquid crystal panel is employed as a display panel, and a backlight which has a light guiding member is sometimes used as the supporting member. Behind the supporting member, another member such as a circuit board is positioned so as to hold the supporting member between the display panel and the circuit board. The other member is attached to an attaching surface of the supporting member, which is a surface of an opposite the side where the liquid crystal panel is supported.

Between the supporting member and the other member (such as circuit board), a connector which has an elastic characteristic is sandwiched therebetween. Owing to the elasticity of the connector, a contacting conductor pressure toward the circuit board is provided. This ensures that the connector and the other member are electrically connected to each other in a highly reliable fashion. Furthermore, a greater tolerance is allowed associated with the attaching error of the supporting member, and thus the reliability of the electric connection is improved. To obtain an elastic connector, a rubber connector or a connector including an elastic strip formed in a torsion spring structure is employed. By employing a torsion spring structure, it is ensured that high-reliability electric connection is achieved at low cost.

Between the connector and the support member, one end portion of an interconnection member is secured, and an another end of the interconnection member is connected to the display panel so that the other member and the display panel are electrically connected to each other via the connector. To obtain an electrical connection of the circuit board and the interconnection member, terminals may be formed on a surface of the interconnection member, and other terminals may be formed on the circuit board. The terminals of an interconnection member and these of the circuit board face each other via the connector. By employing the interconnection member, it is possible to arbitrarily design the location of the connector and the supporting member regardless of the structure of the liquid crystal panel.

To achieve the electrical connection between plurality of electrodes (connection terminals) on the circuit board and the interconnection member, (although it is possible to use a torsion spring structure), a rubber connector is provided. The rubber connector comprises an insulating elastic material and a plurality of conductive members disposed in the insulating material is preferably used. Alternatively the rubber connector comprises an insulating elastic material and a plurality of metal wires rounded the insulating material.

With this connector, ones of the terminals (interconnection terminals) of the interconnection member and respective ones of the terminals of the circuit board are connected by a respective conductive member. Pressure is applied to the insulating elastic material into contact with the other member thereby achieving electric connection between the connector and the other member. This feature allows a reduction in failures such as short circuits and poor electric connection during the production process. Furthermore, it is possible to obtain the elastic characteristic in the contacting direction without causing an increasing in the complexity of the connector.

In this flat panel display device, a recess is formed in the attaching surface of the supporting member, and the connector is disposed in the recess. Specially, the recess is formed in the thick part of the supporting member and the connector is supported by a supporting surface such as a bottom face of the recess. Therefore, the connector is supported by the supporting surface of the supporting member from the backside in a contacting direction thereby determining the relative position between the supporting member and the connector and thus achieving improved reliability associated with the electrical connection. Further, the support member is joined to the other member such as circuit board by an engaging element supporting member formed on the supporting member. Due to the elasticity of the connector, supporting member the connector is urged into contact with the other member thereby electrically connecting the connector and the other member to each other.

In this aspect of the present invention, the supporting member is attached to another member disposed in an electronic device such that the connector is urged into contact with the other member thereby electrically connecting them to each other. It becomes unnecessary to separately perform the process of attaching the supporting member to the other member and the process of electrically connecting the connector to the corresponding connector. As a result, the process of attaching and electrically connecting the liquid crystal display device process becomes very easy. Furthermore, automation of the process of attaching and electrically connecting the liquid crystal display device can be achieved very easily. Herein, the connector may include a terminal part consisting of a plurality of terminals (for example, an interconnection terminal part consisting of interconnection terminals formed on an interconnection substrate). In this case, a corresponding terminal part consisting of a plurality of terminals corresponding to the respective terminals of the connector is formed on the corresponding connector (for example, a connection terminal part consisting of a plurality of connection terminals is formed on a circuit board by means of a patterning technique).

According to the another aspect of the present invention, a asupporting member is arranged behind a display panel which has a flat shape. A flat shaped panel such as liquid crystal panel is employed as a display panel, and a backlight which has a light guiding member is sometimes used as the supporting member. Behind the supporting member, another member such as a circuit board is positioned so as to hold the supporting member between the display panel and the circuit board. The other member such as circuit board is attached to an attaching surface of the supporting member, which is a surface of an opposite the side where the liquid crystal panel is supported.

In the supporting member, an opening is provided and a connector which has an elastic characteristic is inserted into the opening. The liquid crystal display and the circuit board are electrically connected to each other via the connector. For electrical connection of the circuit board and the liquid crystal panel, terminals (panel terminals) are formed on a surface of the, liquid crystal panel, and other terminals are formed on the circuit board. The terminals of the liquid crystal panel and these of the circuit board face each other via connector. To achieve the electrical connection between the electrodes (connection terminals) of the circuit board and the electrodes of the liquid crystal panel, a rubber connector that comprises an insulating elastic material and conductive members disposed in the insulating material is preferably used. Sometimes, a rubber connector comprises an insulating elastic material and a plurality of metal wires wound around the insulating material is used.

In this connector, ones of the terminals of the liquid crystal panel and respective ones of the terminals of the circuit board are connected by the respective conductive member. Pressure is applied to the insulating elastic material into contact with the other member thereby achieving electric connection between the terminals of the liquid crystal panel and those of the other member. In this aspect, the conductive members of the connector are electrically connected to the terminal of the liquid crystal panel in a direct fashion so that it becomes unnecessary to extend an interconnection member along a long path, and thus it becomes possible to reduce the total size of the liquid crystal display device.

In this aspect, an opening is formed in the supporting member, and the connector is disposed between the liquid crystal panel and the circuit board and is attached with an extended part of the liquid crystal panel, in which terminals are formed. Further, in this aspect, a pressing part is provided for supporting the liquid crystal panel by pressing the liquid crystal panel in the contacting direction of the connector toward the circuit board. The pressing part comprises, for example, a part of an outer frame of the liquid crystal panel, which is positioned so as to press the connector from the opposite side thereof so that the deforming stress applied to the liquid crystal panel is further reduced thereby ensuring that the liquid crystal panel is prevented from being damaged.

The liquid crystal display device according to any mode of the present lo invention may be attached to various types of electronic devices. In particular, the liquid crystal display device according to the invention may be advantageously attached in a direct fashion to a circuit board in an electronic device.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

The liquid crystal display device having a flat panel display according to the present invention is described in detail below with reference to preferred embodiments. The embodiments described below are concerned with a liquid crystal device designed to be mounted on a circuit board disposed in a small-sized electronic device. However, the present invention is not limited to such a type of liquid crystal display device. The present invention is applicable to a wide variety of liquid crystal display devices designed to be attached to various types of constituent parts of various types of devices.

[First Embodiment]

Figure 1A:
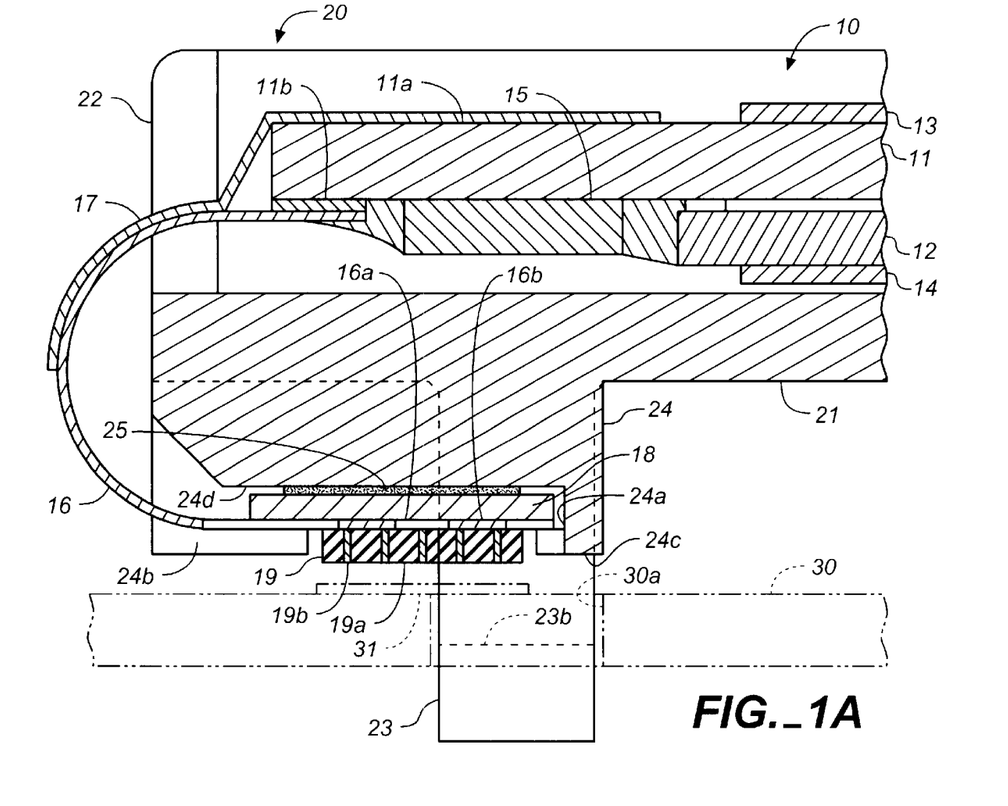
FIG. 1A is an enlarged, partial cross-sectional view illustrating a connector and neighboring parts of a liquid crystal display device according to a first embodiment of the present invention.
Figure 2:
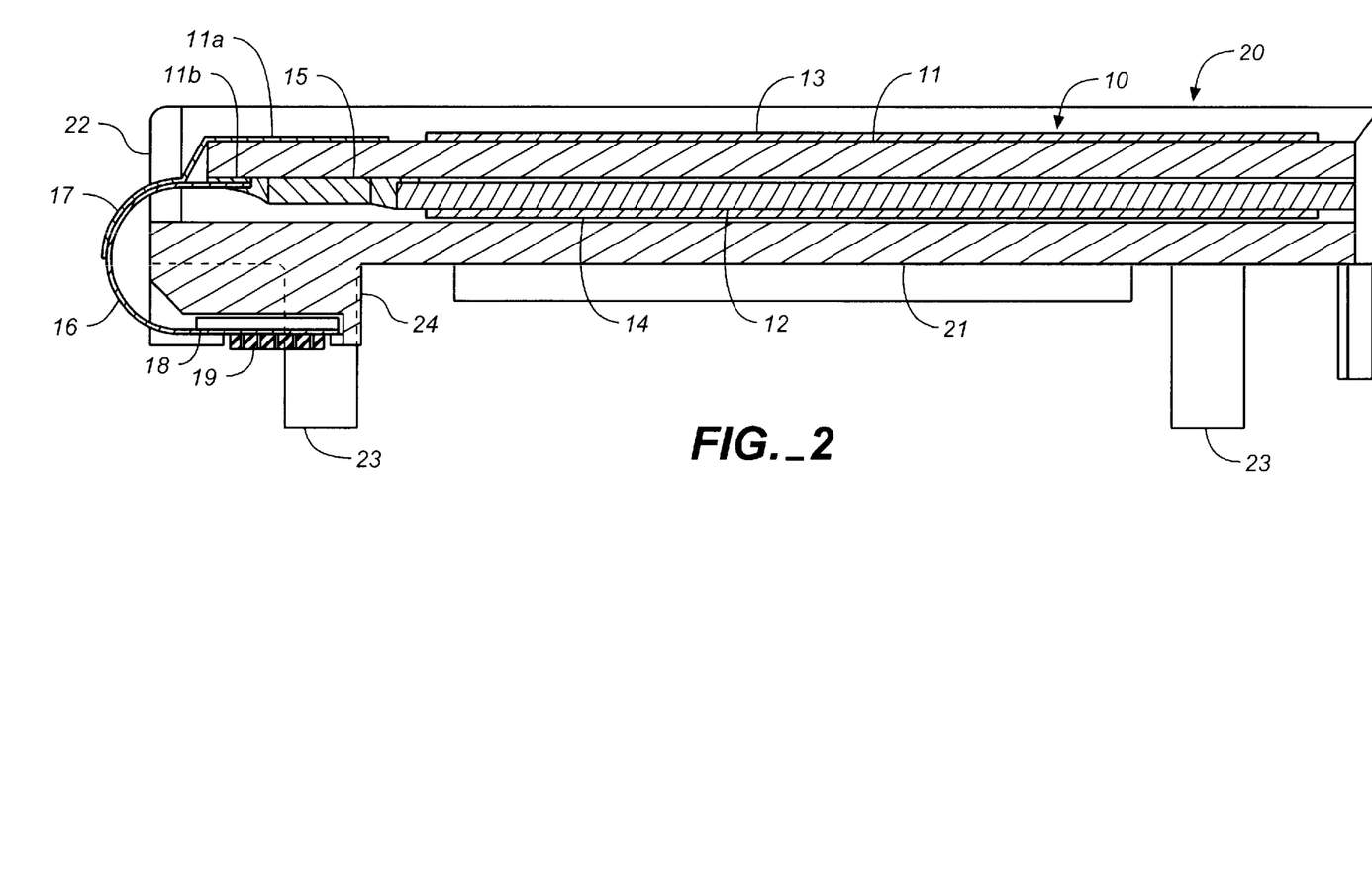
FIG. 2 is a cross-sectional view illustrating the general construction of a first embodiment.
Figure 3:
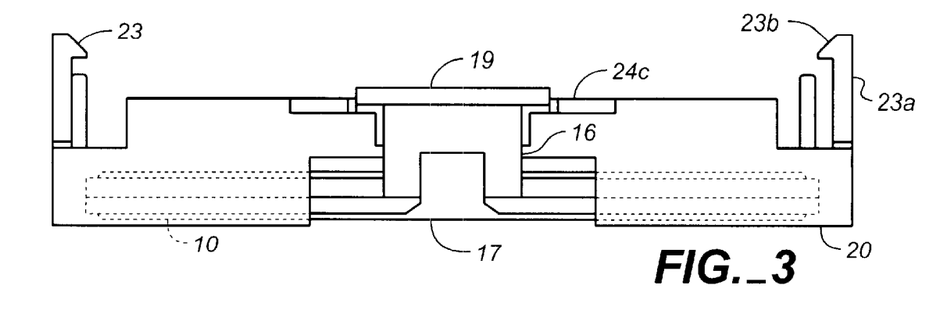
FIG. 3 is a side view of the first embodiment.
Figure 4:
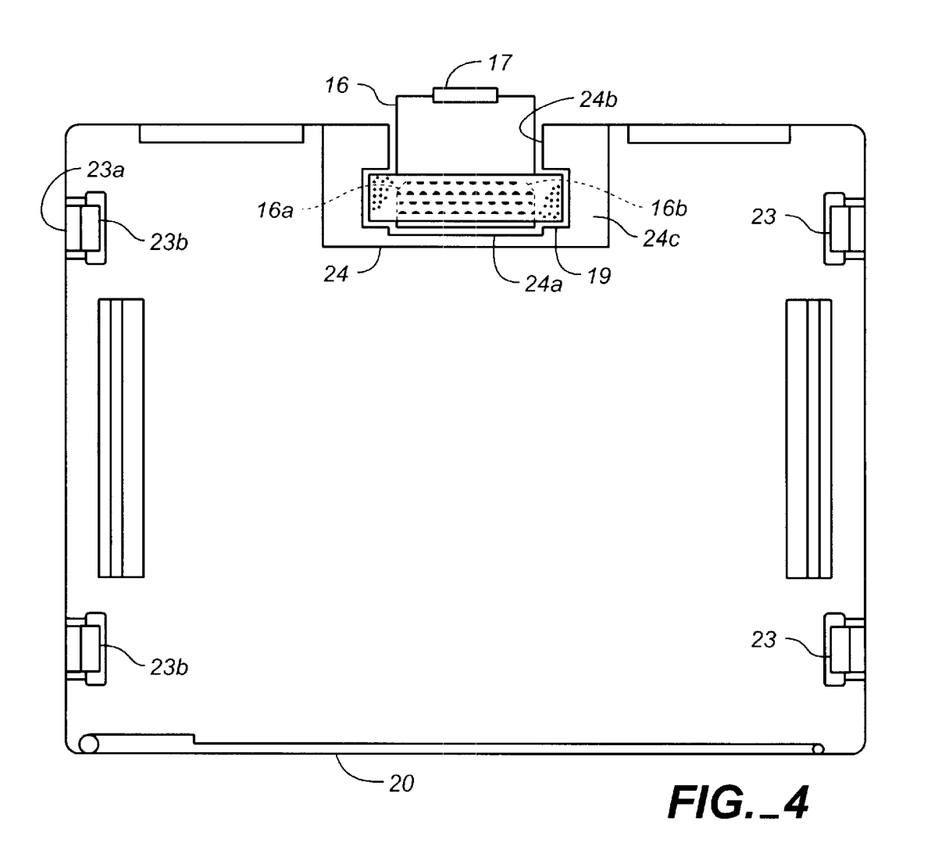
FIG. 4 is a bottom view of the first embodiment.
Figure 5:
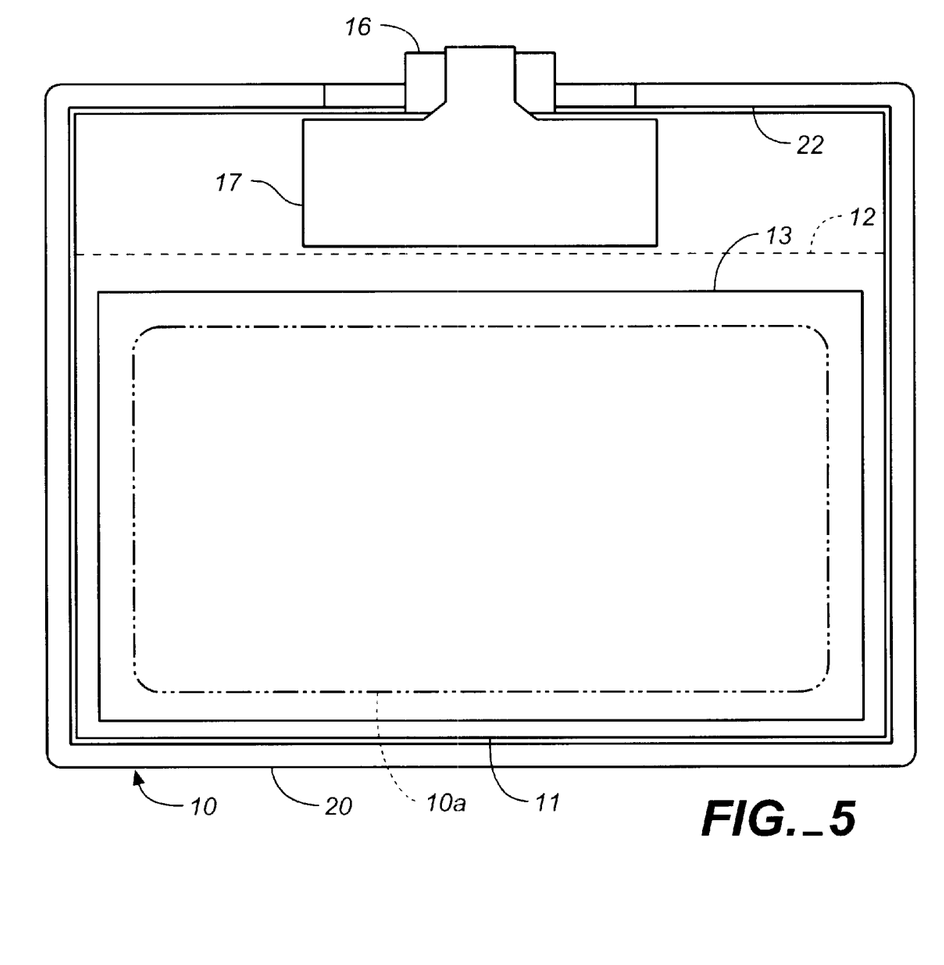
FIG. 5 is a plan view of the first embodiment.

FIG. 1A is an enlarged, partial cross sectional view illustrating a part of a liquid crystal display device according to a first embodiment of the present invention. FIG. 2 is a cross-sectional view illustrating the general construction of the first embodiment. FIG. 3 is a side view of the first embodiment. FIG. 4 is a bottom view of the first embodiment. FIG. 5 is a plan view of the first embodiment.

The liquid crystal display device of the present embodiment includes a liquid crystal panel 10 which includes, as shown in FIG. 2, substrates 11 and 12 each formed of transparent glass or the like and bonded to each other via a sealing material (not shown) such that they oppose each other. A liquid crystal is sealed between the two substrates 11 and 12 such as to form a liquid crystal cell structure, and polarizers 13 and 14 disposed on the outer surface of the respective substrates 11 and 12. In the liquid crystal panel 10, the substrate 11 is greater in area than the substrate 12 and has an extended part 11a extending beyond the edge (contour) of the substrate 12. Electrodes (not shown) are formed on the opposing surfaces of the respective substrates 11 and 12. A plurality of interconnection electrodes for driving the liquid crystal (not shown) are formed on a surface (facing down in the figure) of the extended part 11a, wherein the plurality of interconnection electrodes extend from the inside of the liquid crystal region surrounded by a sealing material and the plurality of interconnection electrodes are electrically connected to the respective electrodes described above. Furthermore, an integrated circuit chip 15 is mounted on the surface (facing down in the figure) of the extended part 11a wherein the integrated circuit chip 15 has input and output bump electrodes (not shown), the output bump electrodes being electrically connected to the ends of the respective interconnection electrodes. Panel terminals 11b are formed on the extended part 11a, near the end of the extended part 11a. A flexible interconnection substrate 16 is electrically connected to the panel terminals 11b. Also, the input bump electrodes of the integrated circuit chip 15 are electrically connected to the respective panel terminals.

The above-described liquid crystal panel 10 is attached via a double-sided adhesive tape or the like (not shown) to the upper surface of a supporting member 20 formed integrally with a light guiding member 21 using a transparent resin. The supporting member 20 includes; the light guiding member 21 having a flat surface on which the liquid crystal panel 10 is supported and serving to guides light emitted from a light source (not shown) so as to illuminate the panel surface of the liquid crystal panel 10 with the light; a frame 22 formed such as to surround the contour (end faces) of the liquid crystal panel 10; and four projections 23 projecting from the back surface opposite to the upper surface on which the liquid crystal panel is supported, the projections 23 serving to firmly connect the supporting member 20 to a circuit board 30 of an electronic device (not shown). The light guiding member 21 includes a thick part 24 formed near one end and projecting from the back surface. The flexible interconnection board 16 is introduced into a region at the back of the thick part 24. That is, a part (thick part 24) of the light guiding member located below the extended part 11a is formed to have a thickness greater than the other part. The flexible interconnection board 16 electrically connected to the panel terminals 11b formed on the extended part 11a is bent around the thick part 24. That is, the flexible interconnection board 16 is first bent downward in the figure and then adhesively attached to a stiffener 17 made of a synthetic resin or the like harder than the flexible interconnection board 16 such that the bent shape of the flexible interconnection board 16 is maintained by the stiffener 17. The stiffener 17 is adhesively bonded to the outer surface (surface exposed to the outside) of the bent portion of the flexible interconnection board 16 and also adhesively bonded to the surface of the substrate 11 opposite to the side where there is the panel terminals 11b electrically connected to the flexible interconnection board 16. Thus, the extended part 11a of the substrate 11 is partially sandwiched between the stiffener 17 and the flexible interconnection board 16.

The thick part 24 and neighboring elements used in the present embodiment are shown, in an enlarged fashion, in FIG. 1A. The supporting member 20 has a recess 24a formed in a backside surface which is opposite to the upper-side surface on which the liquid crystal panel is supported but which is on the side of the extended part 11a of the liquid crystal panel 10, wherein the recess 24a is formed in an area below the extended part 11a. That is, as shown in FIG. 4, the recess 24a is formed by partially recessing the thick part 24 in a direction along its thickness such that the recess 24a has a rectangular shape when seen in a direction perpendicular to a horizontal plane.

Furthermore, an opening recess 24b is formed in the recess 24a such that the opening recess 24b continuously extends from the recess 24a to an outer edge of the supporting member 20. The flexible interconnection board 16 bent in the above-described fashion is placed in the groove of the opening recess 24b from the outer edge of the supporting member 20 into the inside of the recess 24a. In the recess 24a, the end portion of the flexible interconnection board 16 is adhesively bonded to a stiffener 18 made of a synthetic resin or the like thereby reinforcing the flexible interconnection board 16. The stiffener 18 is fixed (securely attached) to the bottom face 24d of the recess 24a via fixing means 25 such as a double-sided adhesive tape. A rubber connector 19 is adhesively bonded to the surface, opposite to the adhesive surface of the stiffener 18, of the flexible interconnection board 16. The rubber connector 19 is formed by disposing a large number of conductive wires 19b such as gold wires in an elastic base member 19a formed of synthetic rubber or the like such that the conductive wires 19b are isolated from one another and extend in the same direction through the elastic base member 19a from the front side to the back side. Both ends of each conductive wire 19b are exposed to the outside at the front and back surfaces of the elastic base member 19a so that both ends of each conductive wire 19a serve as electric contact surfaces. Thus, the rubber connector 19 provides electric conduction only in a direction along the length of the conductive wires 19b. That is, the rubber connector 19 has anisotropic conductivity which allows electric conduction only in a particular direction (from the upper side to the lower side of the rubber connector). Each conductive wire 19b may also be formed of a stainless steel pin or a brass pin whose both ends are covered with a gold film or the like to achieve improved electrical contact. If the rubber connector 19 is compressed in a direction along the thickness by 5 to 30%, the end portions of the conductive wires 19b project to the outside from the front and back surfaces of the elastic base member 19a thereby bringing the conductive wires 19b into contact with conductive members disposed on the front and back sides of the rubber connector 19 thus providing electrical connections between the conductive members. To ensure that the rubber connector 19 is compressed by a compression stroke in the above-described manner, the thickness of the rubber connector 19 is selected such that one side of the rubber connector 19 protrudes to the outside of the recess 24a. That is, the rubber connector 19 slightly protrudes downward in the figure beyond the end face 24c, on the side of the circuit board 30 (on the bottom of the figure), of the thick part 24. In other words, the rubber connector 19 is disposed on the lower side of the extended part 11a such that it projects toward the circuit board 30. The rubber connector 19 is fitted in the recess 24a such that each side face of the rubber connector 19 is in intimate contact with the side wall of the recess 24a, except for the portion projecting beyond the end face 24c of the thick part 24 toward the circuit board 30, (or each side face of the rubber connector 19 is fixed to the side wall of the recess 24a such that no displacement occurs), so that the contact face does not shift when the rubber contact 19 is compressed.

One surface (facing upward in the figure) of the rubber connector 19 is adhesively bonded to the flexible interconnection board 16 such that the rubber connector 19 is in contact with the interconnection terminals 16a (represented by a broken line in FIG. 4) disposed in an array fashion on the flexible interconnection board 16 and electrically connected to the panel terminals 11b panel terminals 11b. Therefore, if the rubber connector 19 is compressively brought into contact with the circuit board 30 such that the other surface (facing downward in the figure) of the rubber connector 19 is brought into contact with a connection terminal part 31 formed on the circuit board 30, then the panel terminal part is electrically connected to the connection terminal part 31. Each projection 23 includes, as shown in FIGS. 3 and 4, a projecting pin 23a projecting from an end part (peripheral part) of the supporting member 20 toward the backside (toward the circuit board 30), and also includes a hook-shaped engaging end part 23b formed on the end of the projecting pin 23a. As shown in FIG. 1A, the circuit board 30 (represented by an alternating long and short dashed line in the figure) in an electronic device, on which the supporting member 20 is mounted, has engaging holes 30a which are formed at locations corresponding to the respective projections 23 so that the engaging holes 30a receive and engage the respective projections 23. The projections 23 are inserted into the respective engaging holes 30a of the circuit board 30, and the respective engaging end parts 23b are latched by the edge portions of the engaging holes 30a shown on the bottom of FIG. 1A. When the projections 23 is engaged in the respective engaging holes 30a, the connection terminal part 31 (including a great number of connection terminals arranged at small intervals) formed on the surface of the circuit board 30 opposing the lower surface (facing downward in the figure) of the rubber connector 19 are urged into contact with the lower surface (facing downward in the figure) of the rubber connector 19. As a result, the rubber connector 19 is compressed by the urging force, and the connection terminal part 31 is electrically connected via the conductive wires 19b of the rubber connector 19 to the interconnection terminals 16a formed on the end portion of the flexible interconnection board 16. Because the interconnection terminals 16a are electrically connected to the panel terminals 11b of the liquid crystal panel 10, the connection terminal part 31 formed on the circuit board 30 is electrically connected to the panel terminals 11b.

Figure 1B:
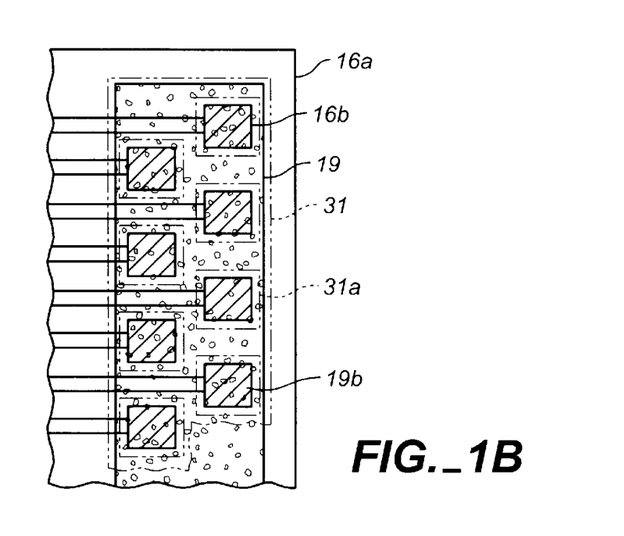
FIG. 1B is a plan view illustrating the connector and a connection terminal part of a circuit board.

FIG. 1B illustrates the relationship in terms of positions in a plane (contact plane where the interconnection terminals 16a is in contact with the lower surface of the rubber connection 19) between the terminals of the interconnection terminals 16a and the terminals of the connection terminal part 31. The interconnection terminals 16b of the interconnection terminals 16a are arranged on the end portion of the flexible interconnection board 16 as represented by means of shading in FIG. 1B. The connection terminals 31a of the connection terminals 31a are arranged such that they overlap the respective interconnection terminals 16b via the rubber connector 19. When the supporting member 20 is attached to the circuit board 30 by means of engagement via the projections 23, the rubber connector 19 is compressed between the interconnection terminals 16a and the connection terminal part 31, and maintained in the compressed state. As a result, electrical connections between the interconnection terminals 16b and the connection terminals 31a via the conductive wires 19b of the rubber connector 19 are also maintained.

FIG. 5 illustrates the appearance of the present embodiment seen from the front side. In the front-side structure of the present embodiment, the liquid crystal panel 10 is disposed in the inside of the frame 22. An effective displaying area 10a serving as an effective area for displaying an image is formed in a panel plane of the liquid crystal panel 10 wherein the effective displaying area 10a includes a driving display area having the capability of displaying an image by means of driving the liquid crystal whereby a desired image is displayed in the effective displaying area 10a.

In the present embodiment, a connector is formed of the interconnection terminals 16a, the stiffener 18, and the rubber connector 19, which are all disposed in the recess 24a of the thick part 24. The connector is firmly attached to the bottom face 24d of the recess 24a. Because the recess 24a is formed at a location which allows the recess 24a to overlap the liquid crystal panel 10 when seen in a direction perpendicular to the panel plane and because the connector is formed in the recess 24a formed at such a location, the supporting member can be formed in a small size. In particular, because the recess 24a is located such that the recess 24a overlaps the panel terminal part of the liquid crystal panel 10 when seen in the direction perpendicular to the panel plane, the panel terminal part of the liquid crystal panel 10 and the connector are located close to each other. This allows the panel terminal part of the liquid crystal panel 10 and the connector to be connected to each other in a simple fashion. This is true also in second and third embodiments which will be described later.

In the present embodiment, as described above, by pressing the supporting member 20, to which the liquid crystal panel 10 is firmly attached, against the circuit board 30 disposed in an electronic device, the projections 23 of the supporting member are inserted into the engaging holes 30a of the circuit board 30 and elastically deformed such that the engaging end parts 23b are latched by the edges of the engaging holes 30a on the side opposite to the side from which the projections 23 are inserted. As a result of such engagement, the contact plane of the rubber connector 19 is urged into contact with the interconnection terminal part 31 which is formed on the circuit board 30 wherein the contact plane of the rubber connector 19 is correctly positioned relative to the interconnection terminal part 31 formed on the circuit board 30 by means of properly setting relative dimensions of the engaging holes 30a of the circuit board and the connection terminal part 31. As a result, the rubber connector 19 is compressed between the thick part 24 and the circuit board 30, and the interconnection terminal part of the flexible interconnection board 16 and the connection terminals 31a are electrically connected to each other via the rubber connector 19.

Therefore, when the liquid crystal display device of the present embodiment is mounted on the circuit board 30 of the electronic device, mechanical fixing and electrical connecting are achieved simultaneously only by pressing the supporting member 20, to which the liquid crystal panel 10 is attached, toward the circuit board 30 while aiming the supporting member 20 at a predetermined position of the circuit board 10. Thus, the process of attaching (assembling) and electrically connecting the liquid crystal panel to the electronic device can be performed at the same time in a rational manner and in a short time. As a result, the attaching and electrically connecting process becomes very simple. Furthermore, automation of the attaching and electrically connecting process can be achieved very easily.

[Second Embodiment]

Figure 6:
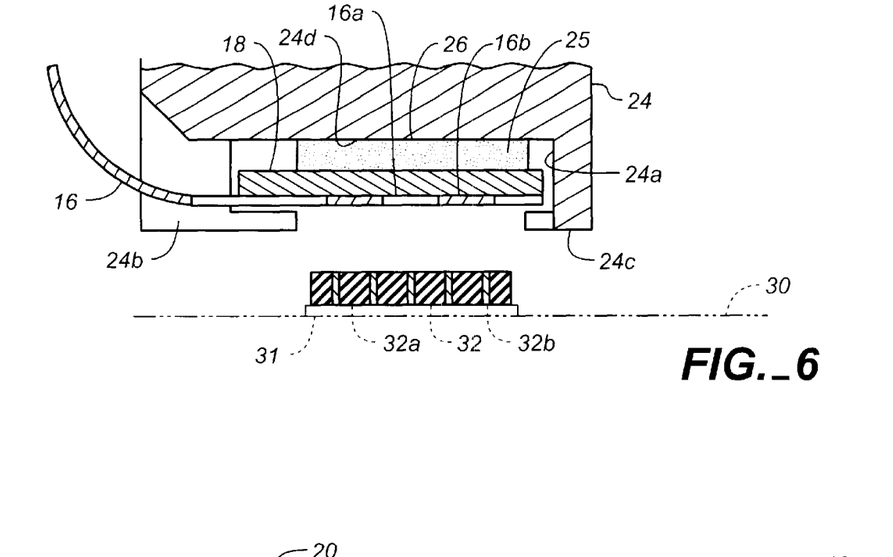
FIG. 6 is an enlarged, partial cross-sectional view illustrating a connector of a liquid crystal display device according to a second embodiment of the present invention.

Referring now to FIG. 6, a second embodiment of the present invention is described below. This second embodiment includes a liquid crystal panel 10 and a supporting member 20 similar to those according to the first embodiment described above, and thus similar parts to those in the first embodiment are denoted by similar reference numerals and they are not described in further detail here. This embodiment is similar to the previous embodiment in that the flexible interconnection board 16 is introduced into the recess 24a of the thick part 24 via the opening recess 24b and that the flexible interconnection board 16 is reinforced by the stiffener 18.

However, in the present embodiment, the interconnection terminals 16b of the interconnection terminals 16a formed on the surface of a part of the flexible interconnection board 16 introduced in the recess 24a are exposed downward. The stiffener 18 adhesively bonded to the flexible interconnection board 16 is also adhesively bonded to an elastic plate 26 which is made of synthetic rubber having good elasticity such as silicone rubber and which is firmly attached to the bottom face 24d of the recess 24a by an adhesive or fixing means 25. In the present embodiment, a connector is formed of the interconnection terminals 16a, the stiffener 18, and the rubber plate 26, which are all disposed in the recess 24a.

On the other hand, a connection terminal part 31 is formed on the surface of the circuit board 30, as in the previous embodiment, and a rubber connector 32 similar to that employed in the previous embodiment is adhesively bonded to the surface of the connection terminal part 31. Like the rubber connector 19 in the previous embodiment, the rubber connector 32 also includes conductive wires 32b extending through an elastic base member 32a.

In the present embodiment, as in the first embodiment, when projections (not shown) are engaged in engaging holes (not shown) of the circuit board 30, the upper surface of the rubber connector 32 disposed on the circuit board 30 is urged into contact with the interconnection terminals 16a of the flexible interconnection board 16 disposed in the recess 24a. As a result, one surface (upper surface in the figure) of the rubber connector 32 receives a pressure from the interconnection terminals 16a in a direction toward the other surface (lower surface in the figure). Hence, the rubber connector 32 is compressed. Because the flexible interconnection board 16 is attached to the thick part 24 of the supporting member via the elastic plate 26, the elastic plate 26 is deformed by the pressure applied from the rubber connector 32. As a result, the flexible interconnection board 16 and the connection terminal part 31 on the circuit board are electrically connected to each other by a particular magnitude of pressure.

To ensure that the rubber connector 32 is compressed by a compression stroke in the above-described manner, the thickness of the rubber connector 32 is selected such that when the rubber connector 32 is introduced into the recess 24a of the thick part 24 until one surface (upper surface in the figure) of the rubber connector 32 comes into contact with the interconnection terminals 16a, a small space remains between the end face 24c of the thick part 24 and the surface of the circuit board 30.

In the structure described above, the rubber connector 32 is disposed on the connection terminal part 31 of the circuit board 30, and the elastic plate 26 is disposed at the back of the flexible interconnection board 16. Alternatively, there may be provided only one of the elastic plate 26 and the rubber connector 32 so as to achieve similar electrical contact. In this case, however, it is required to adjust the relative position between the end face 24c and the contact surface so as to ensure that a proper contacting pressure is obtained.

[Third Embodiment]

Figure 7:
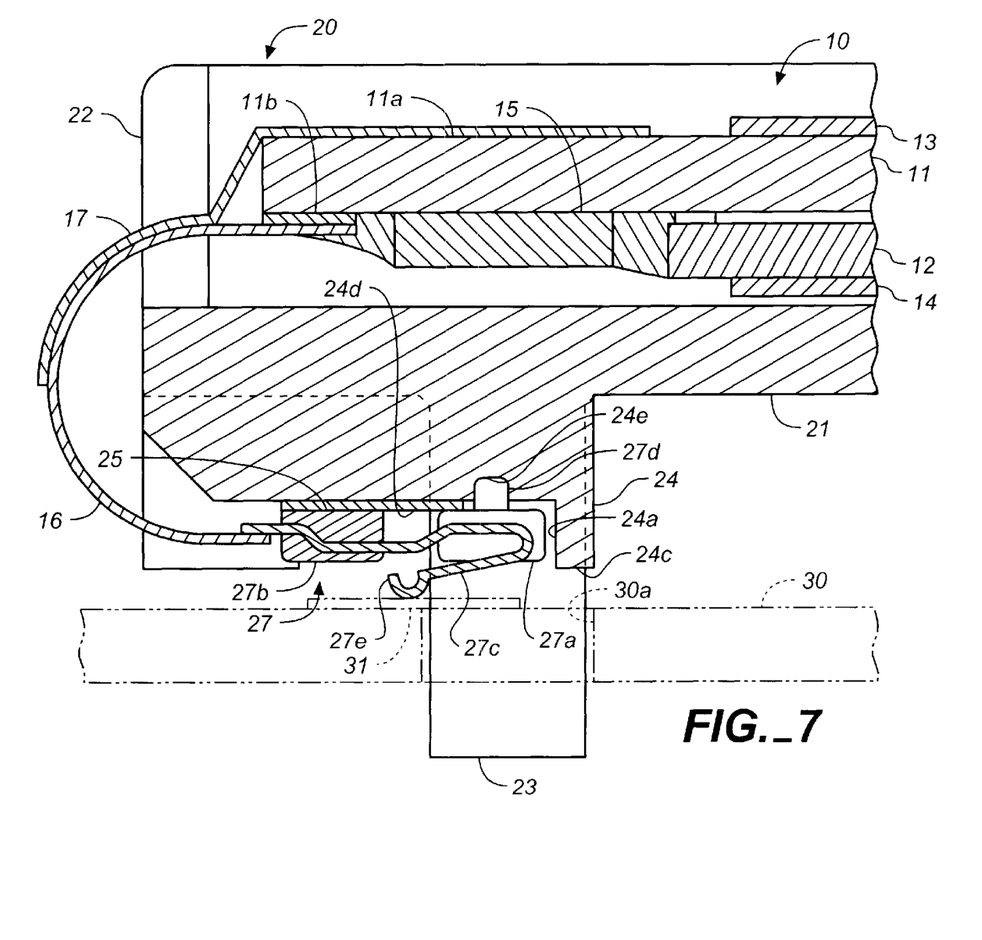
FIG. 7 is an enlarged, partial cross-sectional view illustrating a connector of a liquid crystal display device according to a third embodiment of the present invention.
Figure 8:
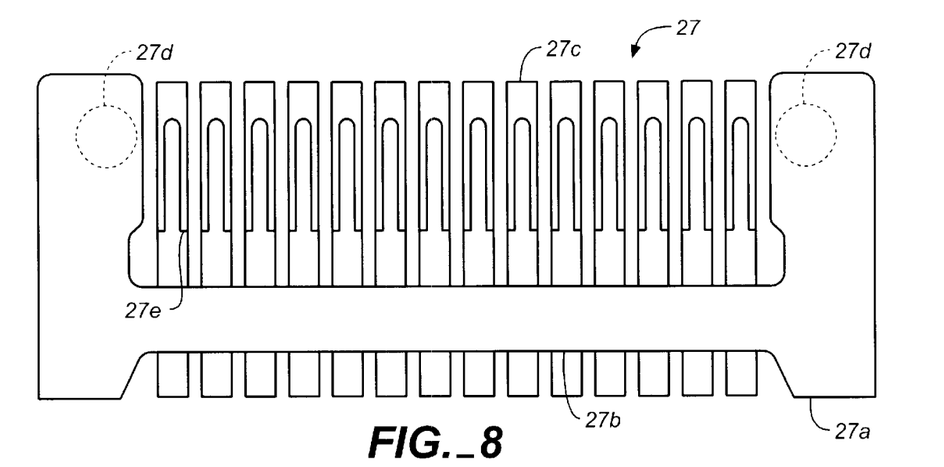
FIG. 8 is a bottom view illustrating the structure of a connection terminal plate according to the third embodiment.

Referring now to FIGS. 7 and 8, a third embodiment of the present invention is described below. This third embodiment includes a liquid crystal panel 10 and a supporting member 20 similar to those according to the first or second embodiment described above, and thus similar parts to those in the first or second embodiment are denoted by similar reference numerals and they are not described in further detail here.

In this third embodiment, the connector is formed by a connector 27, and the connector 27 is disposed in the recess 24a formed in the thick part 24 of the supporting member 20. The connector 27 includes an insulating frame 27a made of a synthetic resin or the like. A plurality of conductive terminal strips 27c having spring properties (elasticity) are fixed in an integral fashion to a bridge 27b of the insulating frame 27a. Each conductive terminal strip 27c is bent and folded, and a contact part 27e is formed on the end of each folded part extending from the bending position in a direction away from the bridge 27b. Furthermore, a pair of bosses 27d are formed on the insulating frame 27a. The bosses 27d are fitted in holes 24e formed in the bottom face 24d of the recess 24a thereby positioning the insulating frame 27a relative to the recess 24a. While maintaining the above-described state, the connector 27 is attached to the inner surface of the recess 24a via fixing means 25 such as a double-sided adhesive tape. Because the connector 27 is fixed by the fixing means 25 in addition to the engagement between the bosses 27d and the holes 24d, no contacting error occurs between the contact part 27e and the connection terminal part 31 on the circuit board 30 when being compressed.

The conductive terminal strips 27c of the connection terminal plate 27 project downward by a small distance beyond the end face 24c of the thick part, that is, beyond the opening edge of the recess 24a so that when the projections 23 are engaged with the circuit board 30 in a similar manner as in the first embodiment, the contact parts 27e of the conductive terminal strips 27c are urged into contact with the connection terminal part 31 formed on the circuit board 30 and thus they are electrically connected. This conductive state is maintained by a contact pressure produced by the elastic force of each conductive terminal strip 27c.

[Fourth Embodiment]

Finally, a fourth embodiment of the present invention is described below with reference to FIG. 9. This fourth embodiment includes the same liquid crystal panel 10 as those employed in the previous embodiments and a supporting member 20 similar to those employed in the previous embodiments. However, there are various differences in the details. Herein, similar parts to those in the previous embodiments are denoted by similar reference numerals. The supporting member 20 includes a light guiding member 21, a frame 22, projections 23, and a thick part 24. A Pressing part 28 is formed on the frame 22 such that the Pressing part 28 projects over the outer surface of the extended part 11a of the substrate. A panel terminals 11b including a large number of terminals arranged in a parallel fashion is formed on a surface of the extended part 11a, opposite to the Pressing part 28.

A through-hole (opening) 24f is formed in the thick part 24 of the supporting member 20 such that the through-hole 24f extends through the thick part 24 in a vertical direction in the figure. A rubber connector 29 having a similar structure to that described above is inserted in the through-hole 24f. That is, the supporting member 20 has the through-hole (opening) 24f which is formed in a backside portion opposite to the upper side where the liquid crystal panel 10 is supported and below the extended part 11a such that the through-hole 24f extends through the backside portion in a direction toward the extended part 11a of the liquid crystal panel 10. A connector is formed by the rubber connector 29. Instead of the shape of a hole, the through-hole 24f may also be formed in the shape of a slit or a groove. The rubber connector 29 is fixed to the panel terminals 11b such that they are electrically connected to each other. In FIG. 9, the bottom portion of the rubber connector 29 project downward by a small distance beyond the end face 24c of the thick part.

Figure 9:
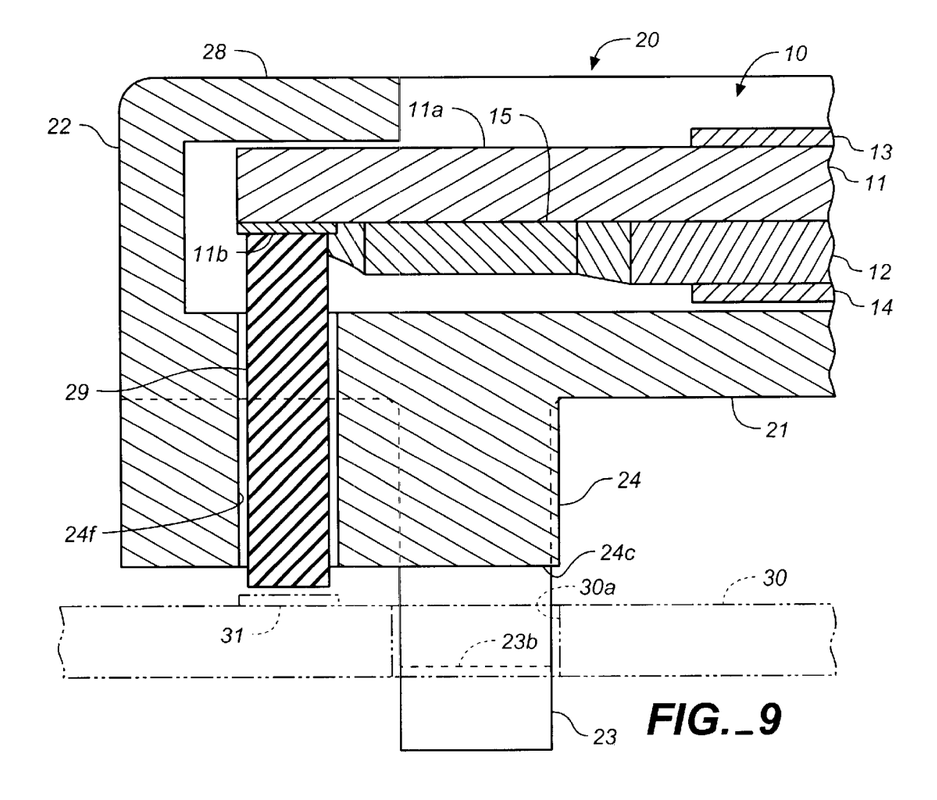
FIG. 9 is an enlarged and partially cross sectioned schematic diagram illustrating a connector of a liquid crystal display device according to a fourth embodiment of the present invention.

In the present embodiment, when the projections 23 are inserted into engaging holes 30a, similar to those in the first embodiment, of the circuit board 30, and the respective engaging end parts 23b are latched by the edge portions, on the lower side in FIG. 9, of the engaging holes 30a, the rubber connector 29 is urged into contact with the connection terminal part 31, and thus the panel terminals 11b and the connection terminals 31a are electrically connected to each other. In this state, the rubber connector 29 is pressed against the extended portion 11a of the substrate 11 by the elastic force of the rubber connector 29 which is generated when the rubber connector 29 is compressed by an attaching pressure obtained when the supporting member 20 is attached to the circuit board 30. Because the Pressing part 28 is located at the back of the extended part 11a, the extended part 11a of the substrate 11 is supported by the pressing part 28 from the backside, when the extended portion 11a receives the elastic force from the rubber connector 29. In other words, the pressure produced by the pressing part 28 and applied to the backside of the extended part 11a serves as at least a part of the attaching pressure by which the supporting member 20 is pressed against the circuit board 30. In this structure, even if a high pressure is applied between the supporting member 20 and the circuit board 30, the liquid crystal panel is prevented from being damaged because the substrate is supported by the Pressing part 28.

Furthermore, because the through-hole 24f is formed such that the through-hole overlaps the liquid crystal panel 10 when seen in a direction perpendicular to the panel plane, and because the rubber connector 29 forming the connector is disposed in the through-hole 24f, the supporting member can be formed in a small size. In particular, because the through-hole 24f is located such that the through-hole 24f overlaps the panel terminal part of the liquid crystal panel 10 when seen in the direction perpendicular to the panel plane, the panel terminal part of the liquid crystal panel 10 and the connector are located close to each other. This allows the panel terminal part of the liquid crystal panel 10 and the connector to be connected to each other in a simple fashion.

Although the present invention has been described above with reference to particular embodiments in conjunction with the drawings, the invention is not limited to those embodiments. Various modifications are possible without departing from the scope of the present invention.

[Advantages]

According to the present invention, as described above, the supporting member is attached to a receiving member via the attaching/engaging elements such that the connector is urged into contact with the receiving connection terminal part of the receiving member thereby electrically connecting them to each other. This becomes unnecessary to separately perform the process of attaching the supporting member to the receiving member and the process of making electrical connections between the connector and the receiving connection terminal part. As a result, the attaching and electrically connecting process becomes very easy. Furthermore, automation of the attaching and electrically connecting process can be achieved very easily.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A liquid crystal display device comprising:
   a liquid crystal panel;
   a supporting member for supporting said liquid crystal panel on a first side of said supporting member, said supporting member comprising an opening and an attaching surface disposed opposite to said first side where said liquid crystal panel is supported;
   an engaging element;
   a second member attached on said attaching surface of said supporting member by said engaging element; and
   a connector arranged in said opening of said supporting member; and
   said supporting member comprising an integral pressing part that applies pressure to said liquid crystal panel to urge said connector into contact with said second member to electrically connect said connector to said second member.

2. A liquid crystal display device of claim 1, wherein said connector comprises an elastic conductive member being urged towards said second member.

3. A liquid crystal display device of claim 1, wherein said connector comprises a conductive member and an insulating elastic material, said conductive member being brought into contact with said second member by a pressure applied to said connector to electrically connect said conductive member to said second member.

4. A liquid crystal display device of claim 1, wherein said connector is electrically connected to said liquid crystal panel in a direct fashion.

5. A liquid crystal display device of claim 1, wherein said pressing part is constructed such that said pressing part presses a mounting part of said connector from a backside of said liquid crystal panel to support the mounting part.

6. A liquid crystal display device comprising:
   a liquid crystal panel;
   a supporting member for supporting said liquid crystal panel on a first side of said supporting member, said supporting member comprising an opening and an attaching surface disposed opposite to said first side where said liquid crystal panel is supported;
   an engaging element;
   a second member attached on said attaching surface of said supporting member by said engaging element; and
   a connector arranged in said opening of said supporting member, and wherein said connector is urged into contact with said second member to electrically connect said connector to said second member; and
   wherein said supporting member comprises a supporting surface through which said supporting member supports said connector from a backside of said connector in a contacting direction towards said second member.

7. A liquid crystal display comprising:
   a liquid crystal panel;
   a supporting member for supporting said liquid crystal panel on a first side of said supporting member, said supporting member comprising an opening and an attaching surface disposed opposite to said first side where said liquid crystal panel is supported;
   an engaging element;
   a second member attached on said attaching surface of said supporting member by said engaging element; and
   a connector arranged in said opening of said supporting member, and wherein said connector is urged into contact with said second member to electrically connect said connector to said second member; and
   wherein said conductive member comprises an elastic strip formed in a torsion spring structure.

8. A liquid crystal display comprising:
   a liquid crystal panel;
   a supporting member for supporting said liquid crystal panel on a first side of said supporting member, said supporting member comprising an opening and an attaching surface disposed opposite to said first side where said liquid crystal panel is supported;
   an engaging element;
   a second member attached on said attaching surface of said supporting member by said engaging element; and
   a connector arranged in said opening of said supporting member, and wherein said connector is urged into contact with said second member to electrically connect said connector to said second member; and
   an interconnection member, wherein said connector is electrically connected to said liquid crystal panel via said interconnection member.

9. An electronic device comprising:
   a display having a flat panel display comprising:
      a display panel having a flat shape;
      a supporting member positioned on a side of said display panel, said supporting member having an opening;
      a circuit board positioned so as to secure said supporting member between said liquid crystal panel and said circuit board; and
      an elastic connector positioned between said supporting member and said circuit board,
      wherein said display panel and said circuit board are electrically connected to each other via said connector, and
      wherein said connector is inserted in said opening.

10. A flat panel display device comprising:
    a display panel having a flat shape;
    a supporting member positioned on a side of said display panel;
    a circuit board positioned so as to hold said supporting member between said display panel and said circuit board, and said circuit board being joined to said supporting member; and
    an elastic connector positioned between said supporting member and said circuit board, wherein said display panel and said circuit board are electrically connected to each other via said connector,
    wherein said supporting member comprises a recess on a side which faces said circuit board,
    wherein said connector is positioned in said recess.

11. A flat panel display device of claim 10 further comprising an interconnection member having a first end connected to said display panel and a second end positioned between said supporting member and said connector,
    wherein said second end is electrically connected with said connector so that said circuit board and said liquid crystal panel are electrically connected to each other.

12. A flat panel display device of claim 11 further comprising:
    a plurality of first terminals arranged on the second end on a side which faces said connector; and
    a plurality of second terminals arranged on said circuit board on a side which faces said connector,
    wherein said connector comprises an elastic insulating material and a plurality of conductive members,
    wherein each of said plurality of first terminals and respective ones of said plurality of second terminals are aligned so as to contact with corresponding ones of said plurality of conductive members.

13. A flat panel display device of claim 10, wherein said connector comprises a spring having a contact portion on one end, said contact portion being electrically connected to said circuit board.

14. A flat panel display device of claim 12, wherein said supporting member comprises a backlight having a light guiding member, wherein said recess is arranged around said light guiding member.

15. A flat panel display device comprising:
- a display panel having a flat shape;
- a supporting member positioned on a side of said display panel, said supporting member having an opening;
- a circuit board positioned so as to secure said supporting member between said liquid crystal panel and said a circuit board, said circuit board being joined to said supporting member; and
- an elastic connector positioned between said supporting member and said circuit board,
- wherein said display panel and said circuit board are electrically connected to each other via said elastic connector, and
- wherein said elastic connector is inserted in said opening.

16. A flat panel display device of claim 15 further comprising:
- a plurality of first terminals formed on said display device;
- a plurality of second terminals arranged on said circuit board on a side which faces said connector,
- wherein said connector comprises an elastic insulating material and a plurality of conductive members,
- wherein each of said plurality of first terminals and respective ones of said plurality of second terminals are aligned so as to contact with corresponding ones of said plurality of conductive members.

17. A flat panel display device of claim 15, wherein said supporting member comprises a backlight having light guiding member, wherein said opening is arranged around said light guiding member.

18. An electronic device comprising:
- a display having a flat panel display comprising:
  - a display panel having a flat shape;
  - a supporting member positioned on a side of said display panel;
  - a circuit board positioned so as to secure said supporting member between said display panel and said a circuit board; and
  - an elastic connector positioned between said supporting member and said circuit board, said display panel and said circuit board are electrically connected to each other via said connector,
  - wherein said supporting member has a recess on a side which faces said circuit board; and
  - wherein said connector being positioned in said recess.

* * * * *